US012597947B2

(12) United States Patent
O'Mahony et al.

(10) Patent No.: US 12,597,947 B2
(45) Date of Patent: Apr. 7, 2026

(54) DATA COMPRESSION WITH TRUSTWORTHY ENERGY AWARENESS

(71) Applicant: Dell Products L.P., Round Rock, TX (US)

(72) Inventors: Aidan O'Mahony, Cork (IE); Ahmed Khalid, Cork (IE); Alan Barnett, County Cork (IE); Stephen J. Todd, North Andover, MA (US)

(73) Assignee: Dell Products L.P., Round Rock, TX (US)

( * ) Notice: Subject to any disclaimer, the term of this patent is extended or adjusted under 35 U.S.C. 154(b) by 115 days.

(21) Appl. No.: 18/421,220

(22) Filed: Jan. 24, 2024

(65) Prior Publication Data

US 2025/0240033 A1     Jul. 24, 2025

(51) Int. Cl.
H03M 7/34          (2006.01)
H03M 7/30          (2006.01)

(52) U.S. Cl.
CPC ................................. H03M 7/6047 (2013.01)

(58) Field of Classification Search
CPC .... H03M 7/30; H03M 7/6064; H03M 7/6094; H03M 7/3088; H03M 7/6011; H03M 7/3059; H03M 7/3084; H03M 7/3086; H03M 7/3097; H03M 7/40; H03M 7/70; H03M 13/3761; H03M 7/3062; H03M 7/3064; H03M 7/3071; H03M 7/3075; H03M 7/3079; H03M 7/3091; H03M 7/3095; H03M 7/4031; H03M 7/4056; H03M 7/42; H03M 7/60; H03M 7/6029; H03M 7/6035; H03M 7/6041; H03M 7/6047; H03M 7/607; H03M 7/6076;
H03M 7/6082; H03M 7/6088; G06F 3/0608; G06F 3/064; G06F 3/0673; G06F 16/1744; G06F 3/0638; G06F 3/0679; G06F 11/1464; G06F 17/18; G06F 3/061; G06F 3/067; G06F 11/14; G06F 11/1448; G06F 11/1451; G06F 11/1461; G06F 11/1469; G06F 11/3409; G06F 11/3452; G06F 12/023; G06F 16/215; G06F 16/221; G06F 16/2228; G06F 16/2282; G06F 16/2455; G06F 16/24561;
(Continued)

(56) References Cited

U.S. PATENT DOCUMENTS 6,253,246 B1    6/2001  Nakatsuyama
6,351,686 B1    2/2002  Iwasaki et al.
(Continued)

OTHER PUBLICATIONS

Cherubini, et al., "Data Prefetching for Large Tiered Storage Systems," 2017 IEEE International Conference on Data Mining (ICDM), New Orleans, LA, USA, 2017, pp. 823-828.
(Continued)

*Primary Examiner* — Linh V Nguyen
(74) *Attorney, Agent, or Firm* — Workman Nydegger

(57) ABSTRACT

Energy aware data compression is disclosed. A storage array may receive data from a client to be compressed. The storage array may request information from a compression awareness engine that is configured to estimate compression times in the context of energy source and energy cost. The storage array makes a decision to compress the data based on the estimates or response received from the compression awareness engine. The data is then compressed and stored in the storage array.

14 Claims, 4 Drawing Sheets

(58) Field of Classification Search

CPC ...... G06F 16/27; G06F 16/9027; G06F 18/22; G06F 2009/4557; G06F 2201/84; G06F 2212/401; G06F 3/0604; G06F 3/0611; G06F 3/0619; G06F 3/0625; G06F 3/0634; G06F 3/0647; G06F 3/065; G06F 3/0653; G06F 3/0656; G06F 3/0659; G06F 3/0661; G06F 3/0683; G06F 9/38; G06F 9/45558; G06F 9/505; G06F 9/5072; G06F 9/5077; G06N 20/00; G06N 3/08; G06N 3/045; G06N 3/0455; G06N 3/084; G06N 3/088; G06N 5/04

USPC .......................................... 341/51, 106, 107

See application file for complete search history.

(56) References Cited

U.S. PATENT DOCUMENTS

| | | | |
|---|---|---|---|
| 7,185,138 B1 | 2/2007 | Galicki | |
| 8,185,712 B2 | 5/2012 | Sarkar et al. | |
| 9,037,672 B2 | 5/2015 | Chang et al. | |
| 9,239,794 B1 | 1/2016 | Merchant | |
| 10,394,453 B1 * | 8/2019 | Bigman | H03M 7/6094 |
| 10,715,176 B1 * | 7/2020 | Singh | H03M 7/3059 |
| 11,829,600 B2 * | 11/2023 | Mizushima | H03M 7/3088 |
| 2002/0026543 A1 | 2/2002 | Tojima et al. | |
| 2003/0217246 A1 | 11/2003 | Kubota et al. | |
| 2007/0011380 A1 | 1/2007 | Kawai et al. | |
| 2007/0096954 A1 * | 5/2007 | Boldt | H04N 19/132 |
| | | | 375/E7.088 |
| 2009/0100470 A1 | 4/2009 | Yai et al. | |
| 2009/0135700 A1 | 5/2009 | Fujibayashi | |
| 2009/0281847 A1 | 11/2009 | Hamilton et al. | |
| 2009/0282273 A1 | 11/2009 | Hamilton et al. | |
| 2010/0070888 A1 | 3/2010 | Watabe et al. | |
| 2012/0106334 A1 | 5/2012 | Tanaka | |
| 2012/0303788 A1 | 11/2012 | Heinrich et al. | |
| 2013/0275794 A1 * | 10/2013 | Annavaram | G06F 1/3234 |
| | | | 713/323 |
| 2013/0339468 A1 | 12/2013 | Chang et al. | |
| 2015/0149130 A1 | 5/2015 | Chiu et al. | |
| 2015/0282039 A1 | 10/2015 | Park et al. | |
| 2016/0148100 A1 | 5/2016 | Chang et al. | |
| 2016/0344646 A1 * | 11/2016 | Wang | H04L 47/38 |
| 2017/0060633 A1 | 3/2017 | Suarez et al. | |
| 2017/0064632 A1 | 3/2017 | Ohshima et al. | |
| 2017/0244969 A1 * | 8/2017 | Wongpaisarnsin | H04N 19/136 |
| 2018/0219965 A1 | 8/2018 | Yellin et al. | |
| 2018/0307640 A1 | 10/2018 | Motai et al. | |
| 2018/0330767 A1 | 11/2018 | Lea et al. | |
| 2020/0167190 A1 | 5/2020 | Bernat | |
| 2020/0185058 A1 * | 6/2020 | Song | G16B 30/00 |
| 2020/0201574 A1 | 6/2020 | Nagata et al. | |
| 2020/0401405 A1 * | 12/2020 | Lasch | H03M 13/3761 |
| 2020/0403633 A1 * | 12/2020 | Lasch | G06F 16/1744 |
| 2021/0026707 A1 | 1/2021 | Rosenberg | |
| 2021/0300401 A1 | 9/2021 | Hashimoto et al. | |
| 2021/0342673 A1 | 11/2021 | Shah et al. | |
| 2021/0342733 A1 | 11/2021 | Kotler et al. | |
| 2021/0344549 A1 * | 11/2021 | Babington | H03M 7/6082 |
| 2022/0066647 A1 * | 3/2022 | Krasner | G06F 3/064 |
| 2022/0210218 A1 | 6/2022 | Nomura et al. | |
| 2023/0122901 A1 * | 4/2023 | Wang | H03M 7/6041 |
| | | | 707/653 |
| 2023/0305703 A1 * | 9/2023 | Zamir | G06F 3/064 |
| 2024/0086328 A1 | 3/2024 | Vazhkudai et al. | |
| 2024/0086711 A1 * | 3/2024 | Wilkins | G06N 3/0455 |
| 2024/0129380 A1 | 4/2024 | Ganju et al. | |
| 2024/0163251 A1 | 5/2024 | Karas | |
| 2025/0244910 A1 * | 7/2025 | Rolo | G06F 3/0608 |

OTHER PUBLICATIONS

Shah et al., "Energy aware routing for low energy ad hoc sensor networks," 2002 IEEE Wireless Communications and Networking Conference Record. WCNC 2002 (Cat. No. 02TH8609), Orlando, FL, USA, 2002, pp. 350-355 vol. 1.

* cited by examiner

DATA COMPRESSION WITH TRUSTWORTHY ENERGY AWARENESS

FIELD OF THE INVENTION

Embodiments of the present invention generally relate to data compression. More particularly, at least some embodiments of the invention relate to systems, hardware, software, computer-readable media, and methods for compressing data with energy awareness.

BACKGROUND

Compressing data is a process that reduces the size of a file or object or of a stream of data. For example, an original size of a file or object may be 6 Megabytes (MB). Once the file or object is compressed, the size of the file may be 4 MB. Compression may be performed in a lossless manner or in a lossy manner. Whether data is compressed in a lossless or lossy manner may depend on various factors such as intended use of the data, storage requirements, or the like. In essence, compression is generally performed to reduce the size of the original data without losing any essential information.

Further, there are many different parameters that may impact the compression operation. Compressions have various settings that impact the compression ratio. However, it is generally true that smaller compressed outputs can be achieved when more time is spent performing the compression operation.

Compressing data can provide significant storage savings. As a result, many storage arrays regularly compress data. However, compressing data, in addition to the monetary cost, is also associated with time and energy costs. For instance, compressing data at a high compression ratio may conserve storage space better than compressing the same data at a low compression ratio. However, compressing the data at higher compression ratios may result in excessive time and energy costs.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings, in which.

DETAILED DESCRIPTION OF SOME EXAMPLE EMBODIMENTS

Embodiments of the present invention generally relate to compressing data. More particularly, at least some embodiments of the invention relate to systems, hardware, software, computer-readable media, and methods for compressing data with energy awareness.

In many storage arrays, data is compressed during the process of committing the data to a storage device. Although compressing the data reduces the storage requirements, compressing the data requires time and energy. Many storage arrays compress data by default and the time allotted for compressing the data may be predetermined. The amount of time spent compressing data may depend on a desired level of compression (e.g., gzip levels) that can be achieved given the allotted time. Selecting higher compression levels requires more time while selecting lower compression levels is faster. Embodiments of the invention advantageously improve data compression operations by accounting for time required to perform the compression operation, energy use and/or energy sources.

Figure 1:
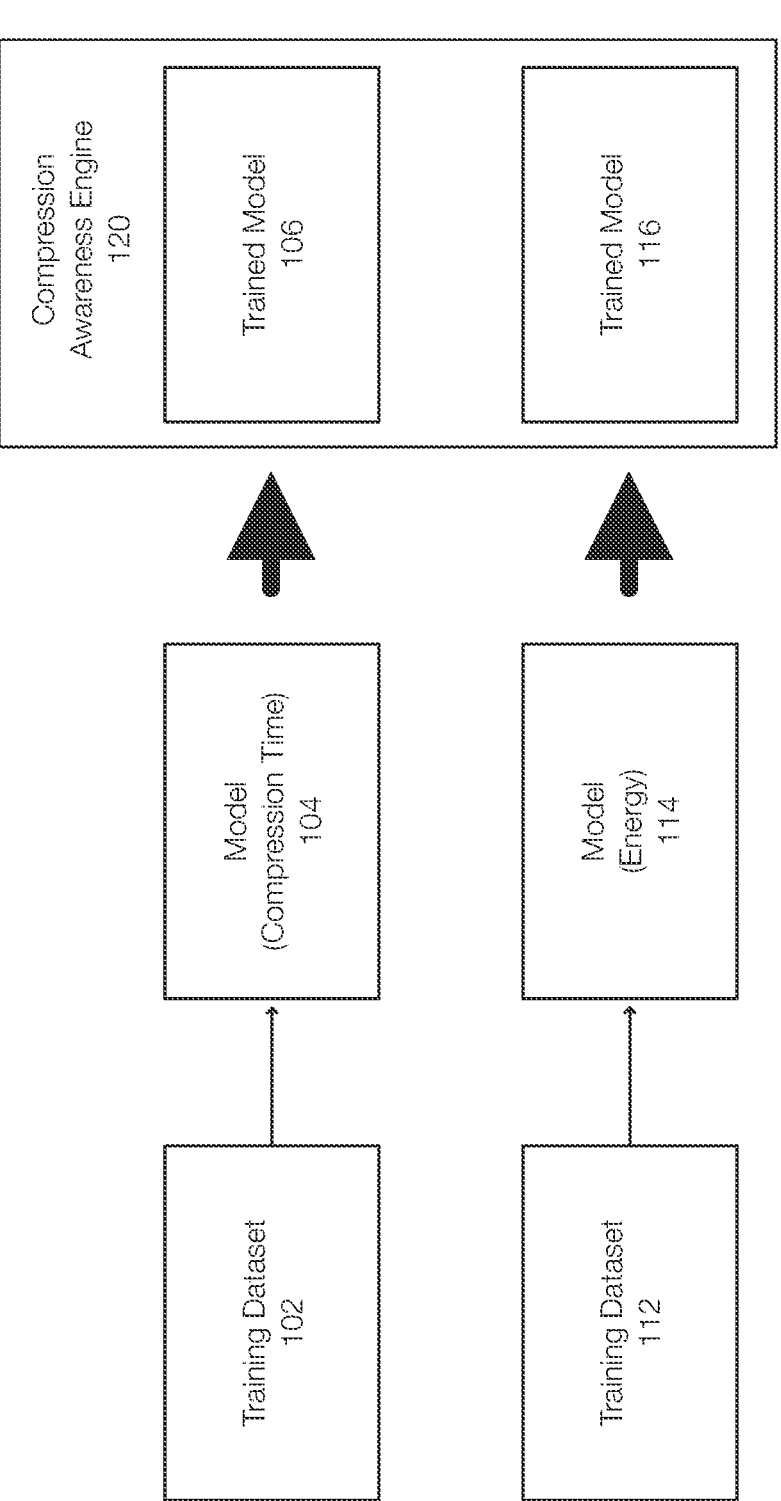
FIG. 1 discloses aspects of machine learning models configured to estimate compression times in the context of energy sources/costs.

FIG. 1 discloses aspects of data compression with energy awareness. FIG. 1 illustrates a model 104 and a model 114 that are trained, respectively, with training datasets 102 and 112. The training dataset 102 includes historical data related to previously performed compression operations that can be used to train the model 104 to predict or estimate a compression time. The training dataset 102 may include information (e.g., features) describing or related to data that was compressed, the resulting compression ratio, filetype, compression time, and the like. This information allows a trained model 106 to be generated that, for a new input data, predicts the compression time. The trained model 106 may receive a desired compression ratio as additional input and generate a predicted compression time for the desired compression ratio. Alternatively, the model 106 may predict or estimate multiple compression times that are each associated with compression ratios or levels. In one example, the model 106 may be executed multiple times for each compression level to generate the various compression times.

The training dataset 112 may include data that can be used to train the model 114. The training dataset 112 may include historical weather data, historical energy costs (renewable and nonrenewable), energy production data, grid conditions, and the like. The trained model 116 can, using current/forecasted weather data and/or current/forecasted renewable energy production data, predict, estimate, or infer a most desirable energy source, cost of energy, or the like.

The compression awareness engine 120 may use the outputs of the trained models 106 and 116 to provide recommendations regarding compression operations. For example, the trained model 106 may indicate that spending additional time compressing data may result in a better compression ratio and that energy cost is currently a good value. This has beneficial effects of generating compressed data that has a smaller size and is less expensive to compress, store, or transmit.

More specifically, when the trained model 116 indicates that energy prices are low or below a threshold cost (e.g., due to good weather for renewable energy sources), the compression awareness engine 120 may recommend higher compression levels or ratios. If the compression awareness engine 120 is able to select the energy source, embodiments of the invention can balance compression levels and energy costs. For example, compression may be performed by a compression engine that uses a specific energy source when advisable. Stated differently, embodiments of the invention may favor renewable energy and recommend compressing the data when renewable energy is contributing to the relevant grid.

The trained model 106 may be representative of multiple models. More specifically, there are many different compression algorithms (compressors). Some compressors, for example, are configured to compress images while other compressors are configured to compress text or other data types. A model 106 may be generated for each of these compressors.

Figure 2:
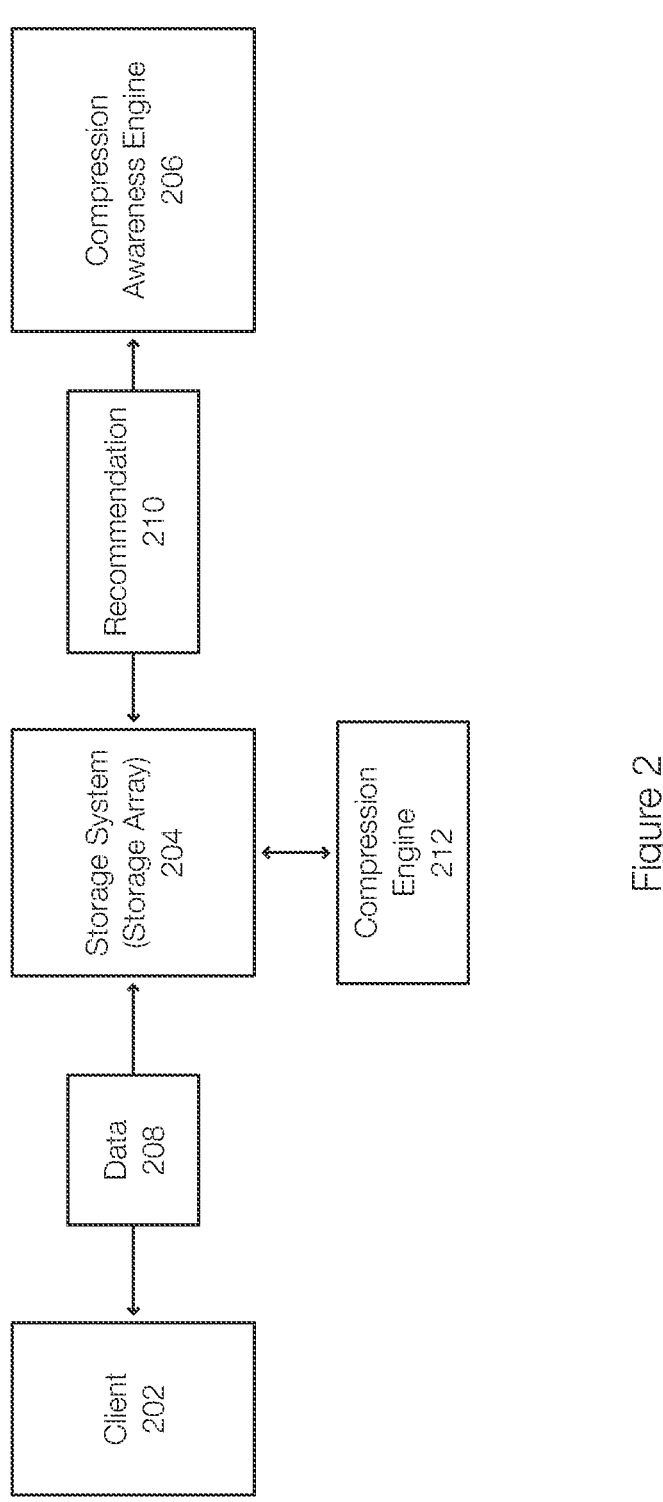
FIG. 2 discloses aspects of an energy aware compression system.

FIG. 2 discloses aspects of a system configured to compress data and store then compressed data in an energy aware manner. FIG. 2 illustrates a storage system (or storage array) 204 that may receive data 208 from a client. The storage system 204 may be configured to compress the data 208 prior to storing the data in storage (e.g., local storage, cloud storage) or transmitting the compressed data to a storage device that may be remote (a different cloud storage).

In this example, the storage system 204 may communicate with the compression awareness engine 206 to obtain a recommendation 210 or inference regarding the process of compressing the data 208 using a compression engine 212. The storage system 204 may identify a type of the data 208 or may specify a particular compressor when seeking the recommendation 210.

The compression awareness engine 206 may be configured to generate an inference or prediction regarding one or more compression levels and corresponding estimated compression times using, for example, the trained model 106 or multiple variations of the model 106. The compression awareness engine 206 may also generate recommendations 210 that relate to the cost of energy given current weather/production conditions, and/or a source of energy. For example, the compression awareness engine 206 may recommend a conventional non-renewable energy source (or using the grid even if a renewable energy source is not contributing to the grid) if weather is preventing or impeding a renewable energy source from producing energy, which may make the cost of the energy higher. If non-renewable energy is producing efficiently, the non-renewable energy may be less expensive and may be selected for the compression operations. In some examples, embodiments of the invention may select an energy source on a per compression basis, a daily basis, periodically, based on weather conditions, energy source location, grid contributions, or the like or combinations thereof.

In another example, the model 116 may estimate a cost of energy give current conditions (e.g., weather, location, time of day). If an expected energy cost is available, higher compression ratios may be recommended if the estimated cost is less than the expected cost. Lower compression ratios may be recommended in the estimated cost is more than the expected or threshold energy cost.

In another example, the compression awareness engine 206 may generate compression times (and/or compression levels) that account for the energy source and/or energy cost.

Figure 3:
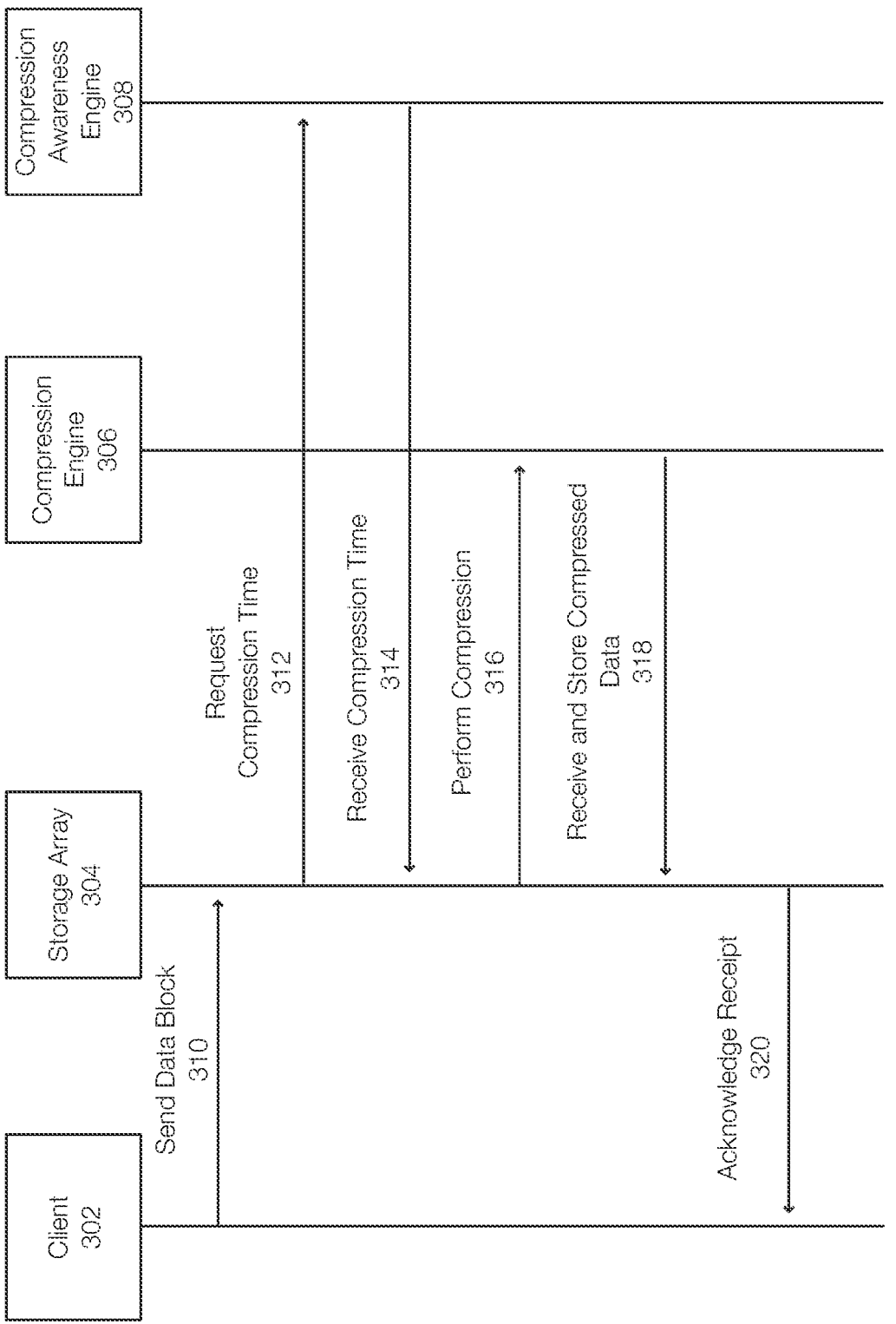
FIG. 3 discloses aspects of a method for energy aware data compression.

FIG. 3 discloses aspects of a method for performing compression operation. FIG. 3 illustrates a client 302 and a storage array 304. The client 302 may be a computing device with a processor, memory, networking hardware, applications, or the like. The client 302 may perform operations according to instructions from an application or a user. In this example, the client 302 sends 310 a data block to a storage array 304. The data block may be sent over a network, which may be a local network, a wide-area network, the Internet, or the like. The storage array 304 may represent cloud storage or the like. The storage array 304 may also be on-premise or local storage.

The storage array receives the data block and requests 312 a compression time estimate from a compression awareness engine 308. The compression awareness engine 308 may generate a response or recommendation that is received 314 by the storage array 304. The response or recommendation from the compression awareness engine 308 may include an estimate or prediction of a compression time to achieve maximum compression, a compression time to achieve minimum compression (or other compression levels), a recommended start time, a recommended compressor, an energy cost, or the like. In one example, the recommendation may include multiple options that allow the storage array 304 to decide which option to select. For example, if energy costs less at a later time and the compression operation can wait, the storage array 304 may wait until the energy cost is decreased prior to performing the compression operation.

The maximum and minimum compressions may be expressed as compression ratios. In one example, the maximum and minimum compressions are determined by the client 304, the storage array 304, or other entity and estimates are generated based on these compression ratios. The compression time generated by the compression awareness engine 308 may include a time to perform the compression operation, a time or time window in which to start the compression operation, and an energy cost for any of the times recommended or predicted by the awareness engine 308.

The response from the compression awareness engine 308 may also inherently account for energy source and/or energy cost in providing the compression times. The response may, alternately, provide an energy assessment separately. For example, the response may indicate that compression is more expensive due to current weather conditions, energy source currently contributing to the grid, or the like. The model, which may be trained to predict or infer energy cost based on weather conditions, allows the compression operation to be performed in an energy aware manner.

Once the inference or estimates (recommendations) are received 314 from the compression awareness engine 308, the storage array 304 may communicate or transfer the data block to a compression engine 306 for compression using a compression level selected by the storage array 304 or recommended by the awareness engine 308. The compression engine 306 may provide multiple compressors. The storage array 304 may also specify the compressor to use, the level of compression, the allowed compression time, or the like. The compressed data block is received 318 from the compression engine 306 by the storage array and stored or committed to the array 302. The storage array 302 may acknowledge receipt 320 of the data block. The acknowledgement 320 informs the client 302 that the data block has been received, compressed, and stored by the storage array 304.

In one embodiment, the recommendation from the awareness engine 308 may include various compression times. For example, the recommendation may include a first option that includes a first start time or time window, a first operation time (time to compress the data), a first compressor, and a first energy cost. A second option may include a second start time or time window, a second operation time, a second compressor, and a second energy cost. In this example, the first energy cost may be based on the inference that a renewable energy source is not contributing to the grid and the second energy cost may be based on the inference that the renewable energy source is contributing to the grid. The storage area, in accordance with its energy policy or other policy, may select the second option even if more expensive. Alternatively, an option may be selected based on any of the other recommendations or combinations thereof.

For example, the first option may not be feasible if compression must be completed before a certain time. Alternatively, the second option may be selected if the expected compressed size and energy cost are acceptable.

As apparent from this disclosure, an embodiment of the invention may possess various useful features and aspects, although no embodiment is required to possess any of such features or aspects. Embodiments of the invention may include or relate to compression operations, energy awareness related operations, energy aware compression level or ratio selection operations, or the like. Embodiments of the invention may relate to any operations related to compressing data in an energy aware manner.

Following are some further example embodiments of the invention. These are presented only by way of example and are not intended to limit the scope of the invention in any way.

Embodiment 1. A method comprising: receiving a data block at a storage array, requesting a compression time from a compression awareness engine that is configured to estimate one or more compression times, selecting a compression time from the one or more compression times, compressing the data block in a compression operation according to the selected compression time to generate a compressed data block, and storing the compressed data block in the storage array.

Embodiment 2. The method of embodiment 1, wherein each of the one or more compression times is associated with a compressor, a compression level, a start time or a start window for the compression operation, a time to perform the compression operation or combination thereof.

Embodiment 3. The method of embodiment 1 and/or 2, wherein the storage array selects one of the compression times based on at least one policy.

Embodiment 4. The method of embodiment 1, 2, and/or 3, wherein the compression time is generated by a machine learning model trained on data associated with historical compression operations.

Embodiment 5. The method of embodiment 1, 2, 3, and/or 4, further comprising accounting for a source of energy or an estimated cost of the energy when performing the compression operation.

Embodiment 6. The method of embodiment 1, 2, 3, 4, and/or 5, wherein estimating the one or more compression times also accounts for the estimated cost of the energy to perform the compression operation.

Embodiment 7. The method of embodiment 1, 2, 3, 4, 5, and/or 6, further comprising selecting a longer compression time when the estimated cost of the energy is lower than a threshold cost.

Embodiment 8. The method of embodiment 1, 2, 3, 4, 5, 6, and/or 7, further comprising selecting a shorter compression time when the estimated cost of the energy is higher than a threshold cost.

Embodiment 9. The method of embodiment 1, 2, 3, 4, 5, 6, 7, and/or 8, further comprising selecting the compression time based on an estimated cost of energy or based on an estimated source of the energy.

Embodiment 10. The method of embodiment 1, 2, 3, 4, 5, 6, 7, 8, and/or 9, further comprising estimating a cost of the energy to perform the compression operation with a machine learning model trained using historical energy costs, weather, and source.

Embodiment 11. A system, comprising hardware and/or software, operable to perform any of the operations, methods, or processes, or any portion of any of these, disclosed herein.

Embodiment 12. A non-transitory storage medium having stored therein instructions that are executable by one or more hardware processors to perform operations comprising the operations of any one or more of embodiments 1-10.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which, when executed, cause a general purpose computer, special purpose computer, or special purpose processing device to perform a certain function or group of functions. As such, some embodiments of the invention may be downloadable to one or more systems or devices, for example, from a website, mesh topology, or other source. As well, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term client, module, component, engine, agent, service, or the like may refer to software objects or routines that execute on the computing system or may also refer to hardware depending on context. These may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments, which may be remote or on-prem, where one or more of a client, server, or other machine may reside and operate in a cloud environment.

Figure 4:
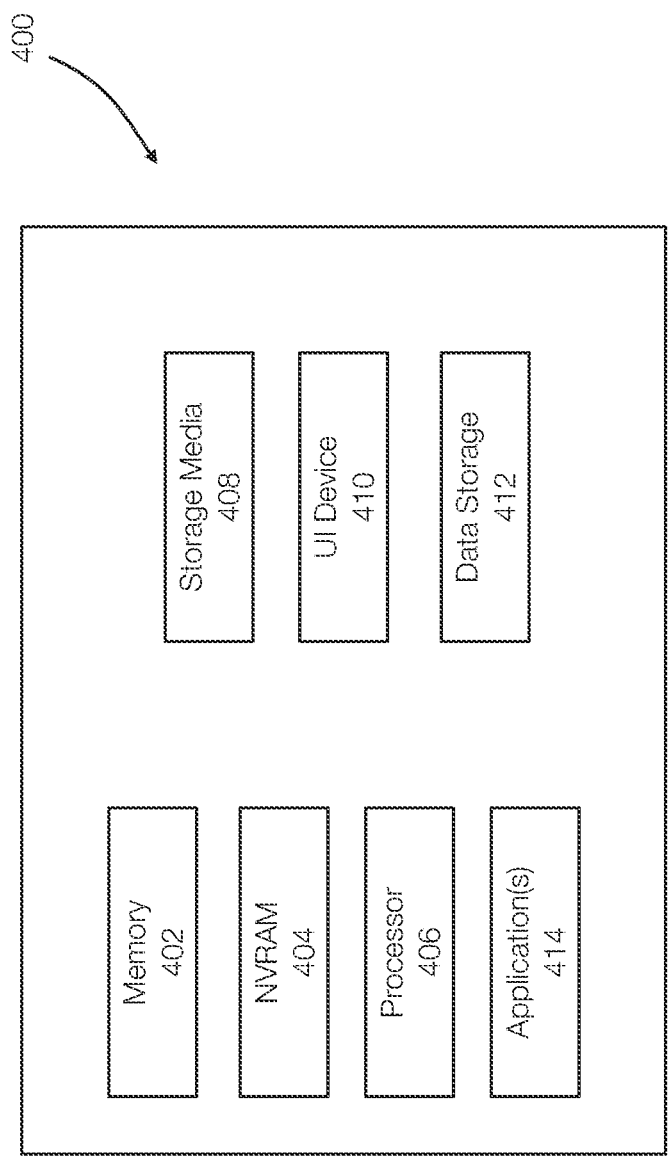
FIG. 4 discloses aspects of a computing device, system, or entity.

With reference briefly now to FIG. 4, any one or more of the entities disclosed, or implied, the Figures and/or elsewhere herein, may take the form of, or include, or be implemented on, or hosted by, a physical computing device, one example of which is denoted at 400. As well, where any of the aforementioned elements comprise or consist of a virtual machine (VM), that VM may constitute a virtualization of any combination of the physical components disclosed in FIG. 4.

In the example of FIG. 4, the physical computing device 400 includes a memory 402 which may include one, some, or all, of random access memory (RAM), non-volatile memory (NVM) 404 such as NVRAM for example, read-only memory (ROM), and persistent memory, one or more hardware processors 406, non-transitory storage media 408, UI device 410, and data storage 412. One or more of the memory components 402 of the physical computing device 400 may take the form of solid state device (SSD) storage. As well, one or more applications 414 may be provided that comprise instructions executable by one or more hardware processors 406 to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud computing site, client, datacenter, data protection site including a cloud storage site, or backup server, to perform any of the functions disclosed herein. As well, such instructions may be executable to perform any of the other operations and methods, and any portions thereof, disclosed herein.

The device 400 may also be representative of servers, clusters of servers, nodes, or the like. The computing resources represented by the device 400 may represent the computing resources of a cloud provider that can be allocated or used for energy aware compression operations.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
receiving a data block at a storage array;
requesting a compression time from a compression awareness engine that is configured to estimate one or more compression times, wherein the estimates for the one or more compression times account for the estimated cost of the energy to perform compression operations;
selecting a compression time from the one or more compression times, wherein the selection includes selecting a longer compression time when the estimated cost of the energy is lower than a threshold cost or selecting a shorter compression time when the estimated cost of the energy is higher than a threshold cost;
compressing the data block in a compression operation according to the selected compression time to generate a compressed data block; and
storing the compressed data block in the storage array.

2. The method of claim 1, wherein each of the one or more compression times is associated with a compressor, a compression level, a start time or a start window for the compression operation, a time to perform the compression operation or combination thereof.

3. The method of claim 2, wherein the storage array selects one of the compression times based on at least one policy.

4. The method of claim 1, wherein the compression time is generated by a machine learning model trained on data associated with historical compression operations.

5. The method of claim 1, further comprising accounting for a source of energy or an estimated cost of the energy when performing the compression operation.

6. The method of claim 1, further comprising selecting the compression time based on an estimated cost of energy or based on an estimated source of the energy.

7. The method of claim 1, further comprising estimating a cost of the energy to perform the compression operation with a machine learning model trained using historical energy costs, weather, and source.

8. A non-transitory storage medium having stored therein instructions that are executable by one or more hardware processors to perform operations comprising:
receiving a data block at a storage array;
requesting a compression time from a compression awareness engine that is configured to estimate one or more compression times, wherein the estimates for the one or more compression times account for the estimated cost of the energy to perform compression operations;
selecting a compression time from the one or more compression times, wherein the selection includes selecting a longer compression time when the estimated cost of the energy is lower than a threshold cost or selecting a shorter compression time when the estimated cost of the energy is higher than a threshold cost;
compressing the data block in a compression operation according to the selected compression time to generate a compressed data block; and
storing the compressed data block in the storage array.

9. The non-transitory storage medium of claim 8, wherein each of the one or more compression times is associated with a compressor, a compression level, a start time or a start window for the compression operation, a time to perform the compression operation or combination thereof.

10. The non-transitory storage medium of claim 9, wherein the storage array selects one of the compression times based on at least one policy.

11. The non-transitory storage medium of claim 8, wherein the compression time is generated by a machine learning model trained on data associated with historical compression operations.

12. The non-transitory storage medium of claim 8, further comprising accounting for a source of energy or an estimated cost of the energy when performing the compression operation.

13. The non-transitory storage medium of claim 8, further comprising selecting the compression time based on an estimated cost of energy or based on an estimated source of the energy.

14. The non-transitory storage medium of claim 8, further comprising estimating a cost of the energy to perform the compression operation with a machine learning model trained using historical energy costs, weather, and source.

* * * * *